United States Patent [19]
Chin et al.

[11] Patent Number: 6,141,282
[45] Date of Patent: *Oct. 31, 2000

[54] CIRCUIT FOR DESIGNATING AN OPERATING MODE OF A SEMICONDUCTOR MEMORY DEVICE

[75] Inventors: Choong-Sun Chin; Hyung-Kyu Lim, both of Seoul, Rep. of Korea

[73] Assignee: Samsung Electronics, Co., Ltd., Suwon, Rep. of Korea

[*] Notice: This patent is subject to a terminal disclaimer.

[21] Appl. No.: 09/234,779

[22] Filed: Jan. 20, 1999

Related U.S. Application Data

[63] Continuation of application No. 08/631,854, Apr. 10, 1996, Pat. No. 5,901,094.

[30] Foreign Application Priority Data

Apr. 13, 1995 [KR] Rep. of Korea ......................... 95-8689

[51] Int. Cl.$^7$ .................................................. G11C 7/00
[52] U.S. Cl. ........................................ 365/225.7; 365/200
[58] Field of Search ................................. 365/200, 255.7, 365/96; 257/529

[56] References Cited

U.S. PATENT DOCUMENTS

| | | | |
|---|---|---|---|
| 4,987,325 | 1/1991 | Seo | 365/230.01 |
| 4,996,672 | 2/1991 | Kim | 365/225.7 |
| 5,459,693 | 10/1995 | Komarek | 365/207 |
| 5,596,536 | 1/1997 | Koh | 365/225.7 |
| 5,633,827 | 5/1997 | Numata | 365/222 |
| 5,657,280 | 8/1997 | Shin | 365/225.7 |
| 5,717,654 | 2/1998 | Manning | 365/233.5 |

*Primary Examiner*—A. Zarabian
*Attorney, Agent, or Firm*—Marger Johnson & McCollom, P.C.

[57] ABSTRACT

A circuit for designating an operating mode of a packaged semiconductor memory device includes a first fuse mounted on the device. A plurality of pads mounted on the device are accessible to a user after the device is packaged. A mode selection circuit generates a first signal when the first fuse is open and a second signal when the first fuse is closed. A first-fuse opening circuit is operably connected to the pads and opens the first fuse responsive to a predetermined first-fuse cutting signal on the pads. In another aspect of the invention, a second fuse may be opened responsive to a predetermined second-fuse cutting signal on the pads. When the second fuse opens, the first-fuse opening circuit is disabled to prevent accidental opening of the first fuse when the desired operating mode requires the first fuse to be maintained intact.

6 Claims, 4 Drawing Sheets

CIRCUIT FOR DESIGNATING AN OPERATING MODE OF A SEMICONDUCTOR MEMORY DEVICE

This is a continuation of Ser. No. 08/631,854 filed on Apr. 10, 1996, U.S. Pat. No. 5,901,094.

BACKGROUND OF THE INVENTION

1. Field of the Invention

The present invention relates to a semiconductor memory device and more particularly to a circuit for designating an operating mode of the semiconductor memory device after the device is packaged.

The present application claims priority from Korean Application No. 8689/1995 which is incorporated herein by reference for all purposes.

2. Description of the Related Art

Semiconductor memory devices often have different operating modes. In the case of, for example, 64M DRAM, there are ×1, ×4, ×8, ×16, . . . , etc., according to the number of input/output pins, and there are 8K and 4K refresh cycles. There is also fast page mode, a static column mode, and an extended data out mode. Different operating modes may be implemented when the device is manufactured by designing different circuits for different semiconductor memory devices but this increases time and expense. It also becomes difficult to control stock of different types of semiconductor memory device. In order to solve the above problems, a method of designing semiconductor memory device has been utilized in which one chip has various operating modes which are selected by opening, or leaving closed, a fuse when the device is manufactured.

FIGS. 1A and 1B are views illustrating a construction of a conventional circuit for designating an operating mode of a semiconductor memory device which utilizes a fuse as discussed above. It is disclosed in U.S. Pat. No. 4,996,672 issued to the assignee of the present application, SAMSUNG Electronics Co., Ltd. FIG. 2 is a view illustrating wave forms generated by the circuits of FIGS. 1A and 1B. In FIG. 1B, a logic high or low state of a mode selection clock ΦM is maintained according to whether a fuse 121 is cut or not. The mode selection clock ΦM is a signal for enabling or disabling a certain operating mode of a semiconductor memory formed on the same substrate and as a part of the same process as that which formed the circuits of FIGS. 1A and 1B.

When an initial power supply voltage VCC is supplied, like signal 211 of FIG. 2, a power supply signal ΦVCC is generated, like signal 212 of FIG. 2. When the power supply signal ΦVCC changes from a logic low state to a logic high state, as does signal 212, a mode enabling signal ΦME, signal 213 of FIG. 2, is generated by a pulse generating circuit shown in FIG. 1A. A pulse cycle of the mode enabling signal ΦME is set by delay cycles of invertors 111, 112, 113. The mode enabling signal ΦME is connected to a gate of an N-MOS transistor 122 in FIG. 1B. While a logic high state of mode enabling signal ΦME is maintained, a turn-on state of an N-MOS transistor 122 is therefore also maintained.

At first, operation of the mode designating circuit of FIGS. 1A and 1B in a state which the fuse 121 is not cut will be described. While the logic high state of the mode enabling signal ΦME is maintained, as shown in signal 213, a current flows through fuse 121 and N-MOS transistor 122. Assuming that a resistance of the fuse 121 is Rf and a turn-on resistance of the N-MOS transistor 122 is Rm, the voltage of a node 151 is maintained as VCC×Rm/(Rf+Rm). When the mode enabling signal ΦME changes to the logic low state, the N-MOS transistor 122 turns off and the voltage of the node 151 increases to the power supply voltage VCC. When the voltage of the node 151 increases to the power supply voltage VCC, the logic state of a node 152 is changed into a logic low state by an invertor 123, thereby turning off the N-MOS transistor 124. Accordingly, the logic state of node 152 is latched into the logic low state by the invertor 123 and the N-MOS transistor 124, and as a result the mode selection clock ΦM goes a logic low state.

Next, operation of the mode designating circuit when fuse 121 is cut is described. While the logic high state of the mode enabling signal ΦME is maintained, as shown in signal 213 of FIG. 2, the N-MOS transistor 122 is turned on. At this time, since the fuse 121 is cut, the current does not flow through the node 151. Accordingly, the potential of the node 151 is in a logic low state. When node 151 goes to the logic low state, the logic state of node 152 changes into a logic high state by invertor 123, thereby turning on the N-MOS transistor 124. Accordingly, the logic high state of the node 152 is maintained, and as a result the mode selection clock ΦM goes a logic high state.

The fuse 121 is cut by a laser prior to packaging the semiconductor memory device in the conventional mode selection circuit of FIGS. 1A and 1B. Accordingly, the operating mode of the semiconductor memory device can be selected only when it is in a wafer state. In other words, the operating mode cannot be designated after packaging of the semiconductor memory device because the fuse 121 must be cut by the laser prior to packaging. This creates several disadvantages. First, it is difficult to control the total stock for various product groups of the semiconductor memory devices. In other words, when demand for semiconductor memory devices configured to operate in a certain mode increases, the memory devices must be configured with the laser, packaged and tested before the product can be shipped to a customer. Also, if an expected demand for the semiconductor memory devices configured in a certain operating mode is not exact or if demand suddenly changes, the semiconductor memory device having the operating mode of interest can be over-supplied or under-supplied.

Second, there is a disadvantage in that product yields are less when the operating mode is designated before packaging. Even though a semiconductor memory device does not pass a test for a specific operating mode, it might operate satisfactorily in other operating modes. When, however, the operating mode of the semiconductor memory device is designated in the wafer state thereof, the designated operating mode cannot be converted into any other operating modes after packaging.

SUMMARY OF THE INVENTION

It is an object according to the present invention to provide a circuit for designating an operating mode after a semiconductor memory device is packaged.

It is another object according to the present invention to provide a circuit for selectively designating an operating mode of a semiconductor memory device.

In order to accomplish these objects of the invention, a circuit for designating an operating mode of a packaged semiconductor memory device includes a first fuse mounted on the device. A plurality of pads mounted on the device are accessible to a user after the device is packaged. A mode selection circuit generates a first signal when the first fuse is open and a second signal when the first fuse is closed. A first-fuse opening circuit is operably connected to the pads and opens the first fuse responsive to a predetermined first-fuse cutting signal on said pads. In another aspect of the invention, a second fuse may be opened responsive to a predetermined second-fuse cutting signal on the pads. When the second fuse is open, the first-fuse opening circuit is disabled to prevent accidental opening of the first fuse when the desired operating mode requires the first fuse to be maintained intact.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

A term "ΦENT" is a fuse cutting enable clock, "ΦFCE" being a fuse cutting control clock, "ΦMi" being a specific mode selection clock, "PC" being a fuse cutting mode entry request signal, "ΦVCC" being a power supply signal, "ΦME" being a mode enable signal, and "Ai" being a mode selection address.

Figure 1A:
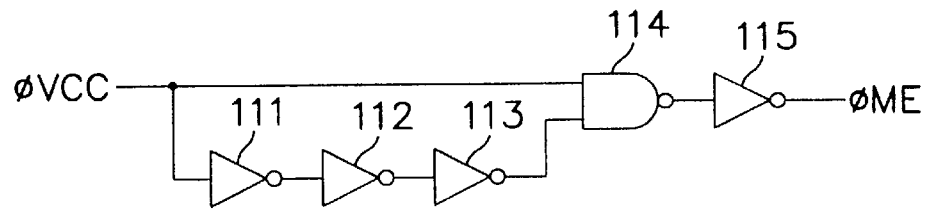
FIGS. 1A and 1B are views illustrating a conventional operating mode designating circuit of a semiconductor memory device.
Figure 1B:
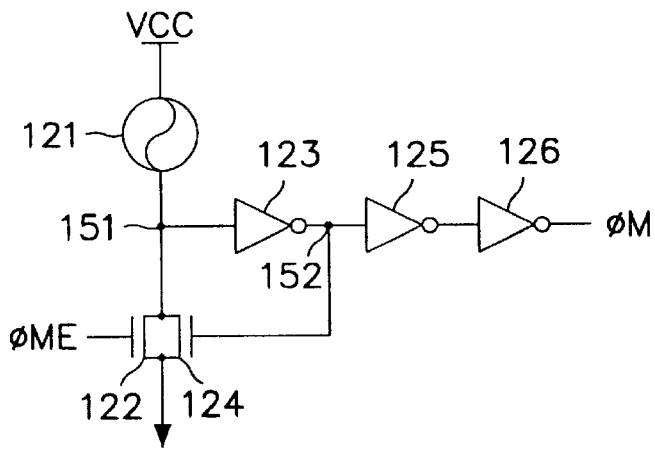
Figure 2:
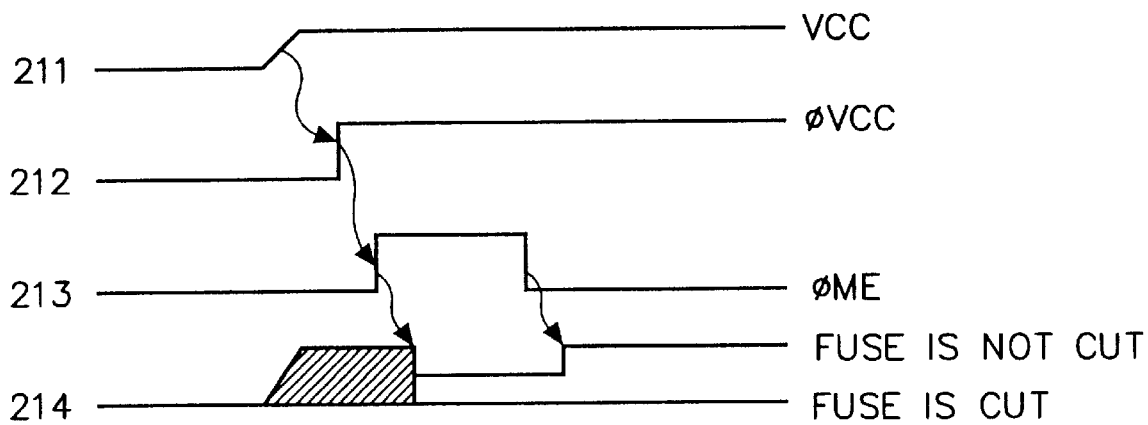
FIG. 2 is a view illustrating wave forms generated by the circuit of FIGS. 1A and 1B.
Figure 3:
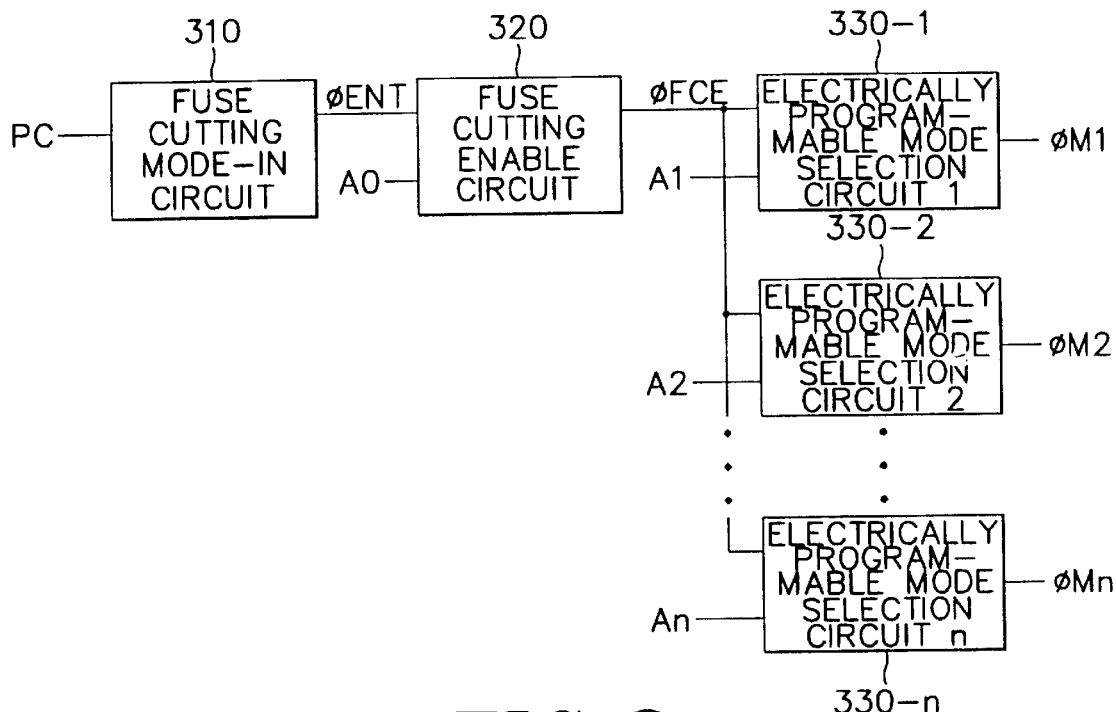
FIG. 3 is a block diagram illustrating an operating mode designating circuit for a semiconductor memory device according to the present invention.

FIG. 3 is a block diagram illustrating a circuit for designating an operating mode of a packaged semiconductor memory device according to the present invention. A signal PC is applied to a fuse cutting mode-in circuit 310. In response thereto, circuit 310 generates a fuse cutting enable clock ΦENT signal. The fuse cutting enable clock ΦENT and a control address A0 are applied to a fuse cutting enable circuit 320. Circuit 320 includes a fuse for preventing, when opened, a mode of operation in which fuses in circuits 330-1 to 330-n may be opened. The fuse in circuit 320 is cut when control address A0 goes to a logic high level when ΦENT is also at a logic high level. Fuse cutting enable circuit 320 generates a signal ΦFCE depending on whether the fuse in circuit 320 is cut or not. When the fuse in circuit 320 is not opened, when A0 is at a low level and when ΦENT is at a logic high level, circuit 320 generates signal ΦFCE. Electrically programmable mode selection circuits 330-1 to 330-n each include a fuse for selecting an operating mode associated with each of the mode selection circuits. The signal ΦFCE is commonly inputted to the electrically programmable mode selection circuits 330-1 to 330-n. Ai of the mode selection addresses A1 to An is correspondingly inputted to the electrically programmable mode selection circuits 330-1 to 330-n. When the corresponding mode selection address Ai is at a logic high level when the signal ΦFCE is also high, the mode selection circuits 330-1 to 330-n cut the internal fuse thereby selecting the designated operating mode.

The operating mode designating operation of the semiconductor memory device having the above-mentioned construction will now be described. The semiconductor memory device includes a circuit for entering the fuse cutting mode after packaging. Once the fuse cutting mode is entered, the fuse for designating the specific operating mode by the mode selection address Ai is selectively cut thereby designating the desired operating mode of the semiconductor memory device.

Figure 4:
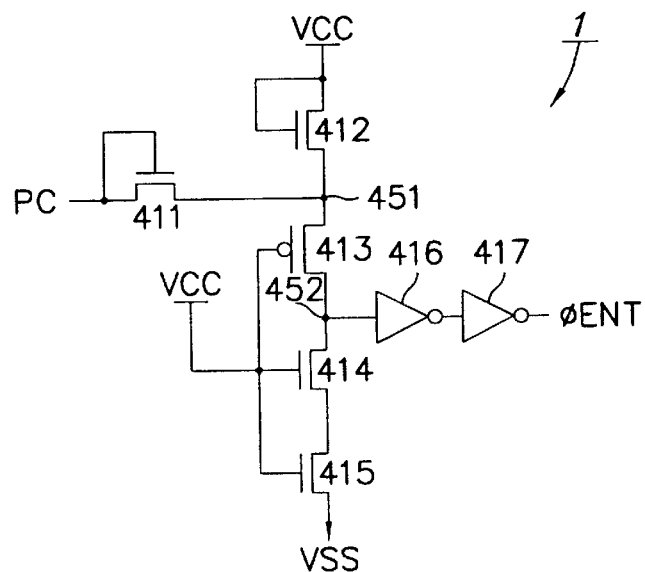
FIG. 4 is a view illustrating the fuse cutting mode-in circuit of FIG. 3.

With reference to FIG. 4, signal PC for entering the fuse cutting mode is a high voltage signal having a voltage level higher than an operating power supply voltage of the semiconductor memory device. A drain electrode and a gate electrode of an N-MOS transistor 411 are commonly connected to an input terminal of the signal PC, and a source electrode thereof is connected to a node 451. The drain electrode and the gate electrode of an N-MOS transistor 412 are commonly connected to a power supply voltage VCC, and the source electrode thereof is connected to the node 451. The source electrode of a P-MOS transistor 413 is connected to the node 451, the drain electrode thereof is connected to a node 452, and the gate electrode thereof is connected to the power supply voltage VCC. N-MOS transistors 414 and 415 are serially connected between the node 452 and a ground voltage VSS, and the gate electrode thereof is commonly connected to the power supply voltage VCC. Invertors 416 and 417 are serially connected between the node 452 and an output terminal of the invertor 417. The inverters 416 and 417 reduce the signal level generated at node 452 into a signal ΦENT having a C-MOS logic level at the output of invertor 417.

Operation of fuse cutting mode-in circuit 310 will now be described. The fuse cutting mode-in circuit 310 senses the signal PC, thereby generating an internal clock signal ΦENT representing entry into the fuse cutting mode. At this time, the signal PC is assumed to be a high voltage signal having a voltage level higher than the power supply voltage VCC. Here, assuming that the threshold voltage of the N-MOS transistor 411 is Vtn, that the threshold voltage of the P-MOS transistor 413 is Vtp, and that the operating power supply voltage supplied is VCC, the signal PC should have the voltage level higher than the total voltage of VCC+Vtn+Vtp.

When PC is not present, the node 451 has a voltage equal to VCC−Vtn. The gate electrode of the P-MOS transistor 413, connected between the nodes 451 and 452, is connected to the power supply voltage VCC, thereby turning off the P-MOS transistor 413. When the P-MOS transistor 413 is turned off, the node 452 goes a logic low state, as does the logic state of the signal ΦENT which is supplied from node 452 through the inverters 416 and 417. As a result, if the signal PC is not supplied, the signal ΦENT is at a logic low level so that the entry of the fuse cutting mode is cut off.

When the signal PC is supplied to circuit 310, it has a voltage level higher than the total voltage VCC+Vtn+Vtp, thereby turning on the N-MOS transistor 411. As a result, the voltage at node 451 drops as much as the threshold voltage Vtn of the N-MOS transistor 411. The voltage of the node 451 is a voltage level higher than the voltage VCC+Vtp. Accordingly, a voltage difference between the node 451 and a gate node of the P-MOS transistor 413 is higher than the threshold voltage Vtp of the P-MOS transistor 413, thereby turning on the P-MOS transistor 413. As a result, node 452 has the power supply voltage VCC. The voltage of the node 452 outputted through the inverters 416 and 417 goes to a logic high state having the C-MOS logic level. The output signal of the invertor 417 is the clock ΦENT for enabling the fuse cutting mode when in a logic high state.

As described above, the fuse cutting mode-in circuit 310 senses the applied signal PC, thereby enabling the clock ΦENT. The voltage of the signal PC, which as described above must be higher than the total voltage of VCC+Vtn+Vtp, should be higher than a maximum of an input voltage indicated in the product specification. Otherwise, the signal PC cannot be distinguished from general input signals.

The present invention is illustrated through an example constructing the fuse cutting mode-in circuit 310 as a high voltage sensing circuit, but in other examples, the fuse cutting mode-in circuit 310 can be constructed as a circuit for sensing a specific timing signal not being used. In this case, the fuse cutting mode-in circuit 310 senses the specific timing signal inputted through an external input pin, thereby enabling the clock ΦENT. In the present embodiment, however, circuit 310 is constructed to sense high voltage signal PC to enable ΦENT.

Figure 5A:
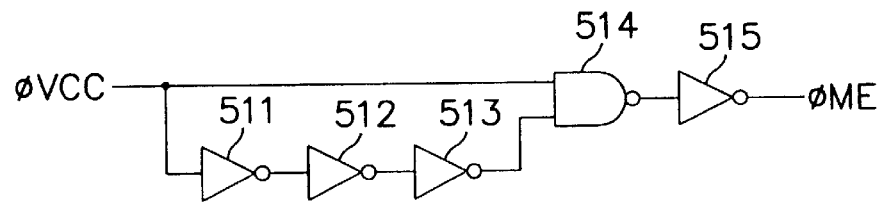
FIGS. 5A and 5B are views illustrating the fuse cutting enable circuit of FIG. 3.

The present invention could be practice by applying clock ΦENT directly to the electrically programmable mode selection circuits 330-1 to 330-n and utilizing it as a control signal to cut the fuses for designating the specific operating modes associated with each of mode selection circuits 330-1 to 330-n. The semiconductor memory device according to the present embodiment of the invention, however, further comprises fuse cutting enable circuit 320, which performs a fuse cutting operation by generating the clock ΦFCE, which acts as a control signal to cut the fuses for designating the specific operating modes associated with each of mode selection circuits 330-1 to 330-n, responsive to clock ΦENT. Fuse cutting enable circuit 320 prevents undesired fuse cutting which can occur in the case of directly applying the clock ΦENT to the mode selection circuits 330-1 to 330-n. To prevent such undesired fuse cutting, when the semiconductor memory device according to the present invention is manufactured, a specification for the signal PC should be listed in the semiconductor memory device. Even though the specification of the semiconductor memory device provides users with a maximum input signal level under the level of signal PC, to prevent undesired fuse cutting, accidental fuse cutting may occur as a result of careless use or responsive to signal noise. To solve this problem, the semiconductor memory device according to the present invention further comprises the fuse cutting enable circuit 320 between the fuse cutting mode-in circuit 310 and the mode selection circuits 330-1 to 330-n. An embodiment therefor is illustrated in FIGS. 5A and 5B.

Figure 5B:
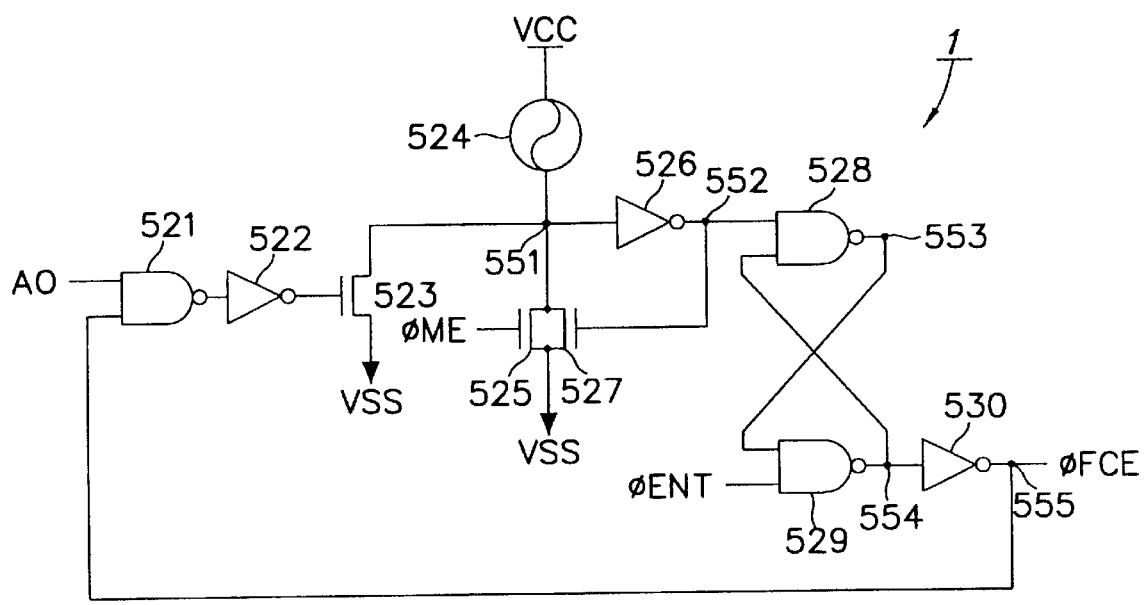

As illustrated in FIG. 5B, the fuse cutting enable circuit 320 comprises a fuse 524 which can be electrically cut. An N-MOS transistor 523 is turned on responsive to clock ΦFCE and a cutting control address A0 being simultaneously at a logic high level, thereby forming a path for a large current. As a result, the fuse 524 is cut.

First, the operation of the fuse cutting enable circuit 320 when clock ΦENT is not enabled will be described. When clock ΦENT goes a logic low state, a NAND gate 529 generates a logic high signal at a node 554. A logic low signal is generated by an invertor 530 at a node 555, thereby disabling the clock ΦFCE into a logic low state. Accordingly, the fuse cutting operation cannot be carried out. Also, node 555 is connected to an input terminal of the NAND gate 521; a logic high signal is therefore generated by NAND gate 521 by the logic low state of the clock ΦFCE irrespective of a logic state of the clock control address A0, thereby turning off the N-MOS transistor 523. Accordingly, the non-cutting state of the fuse 524 is maintained.

Operation of circuit will now be considered when the clock ΦENT is enabled and the cutting control address A0 is disabled. If an initial operating power supply voltage VCC is supplied, the power supply signal ΦVCC is generated when the operating power supply voltage VCC stabilizes. The power supply pulse signal ΦVCC is directly applied to one input of a NAND gate 514 and to the other input of the NAND gate 514 after being delayed through inverters 511 to 513. Accordingly, after the power supply pulse signal ΦVCC is generated, a pulse signal is generated during a delay period set by the inverters 511 to 513. An invertor 515 inverts the logic low state of the generated pulse signal into a logic high state thereof which is output from the invertor 515 as signal ΦME.

When the signal ΦME is enabled into a logic high state, an N-MOS transistor 525 of FIG. 5B turns on. As a result, a current path passing through the fuse 524 and the N-MOS transistor 525 is formed, thereby maintaining the voltage of a node 551 corresponding to a resistance ratio of the fuse 524 and the N-MOS transistor 525. When the logic state of the signal ΦME changes into a logic low state, the N-MOS transistor 525 turns off, so that the logic state of the node 551 goes to the power supply voltage VCC level. Accordingly, the logic state of a node 552 assumes a logic low state due to invertor 526, thereby turning off an N-MOS transistor 527. When the logic state of the node 522 becomes the logic low state, the logic state of a node 553 goes to a logic high state as a result of a NAND gate 528.

Because one input terminal of NAND gate 529 is connected to the clock ΦENT and the other input terminal is connected to the node 553, NAND gate 529 determines a logic state of a node 554 in dependence upon the logic state of the clock ΦENT. If the logic state of the clock ΦENT is enabled into the logic high state, the logic state of the node 554 goes the logic low state. An invertor 530 inverts the logic low signal of the node 554 into a logic high signal. The inverted signal of the node 554 is output from the invertor 530. Accordingly, the clock ΦFCE is simultaneously enabled and applied to the mode selection circuits 330-1 to 330-n. If the clock ΦFCE is enabled, the mode selection circuits 330-1 to 330-n cut the internal fuse at the time of enabling the corresponding mode selection address Ai, thereby designating the operating mode associated with the cut fuse.

Third, to disable the fuse cutting mode, i.e., to make fuse cutting impossible after a desired operating mode of circuits 330-1 to 330-n is designated, the logic state of the fuse cutting control address A0 is enabled into a logic high state while clock ΦFCE is also made high as described above. The logic high state of the address A0 is input to one input terminal of the NAND gate 521, which has the other input terminal connected to the node 555, producing a logic low signal at the output of the NAND gate 521. Invertor 522 inverts the logic low signal output from the NAND gate 521 into a logic high signal. As a result, the N-MOS transistor 523 connected between node 551 and the ground voltage VSS turns on, thereby forming a current path passing through the fuse 524 and the N-MOS transistor 523. A large current path is formed because the size of N-MOS transistor 523 is large. As a result, the fuse 524 opens.

When the signal ΦME is enabled into the cutting state of the fuse 524, the N-MOS transistor 525 turns on. The path between the power supply voltage VCC and the node 551 is open because fuse 524 is open, thereby changing the logic state of the node 551 into a logic low state. When the logic state of the node 551 becomes a logic low state, the logic state of the node 552 is inverted into the logic high state by the invertor 526. As a result, the N-MOS transistor 527 turns on thereby maintaining the logic low state of the node 551. This latches invertor 526 and the N-MOS transistor 527 thereby continuously maintaining the turned on state of the N-MOS transistor 527 even when the logic state of the signal ΦME changes into a logic low state. The logic low state of the node 551 and the logic high state of the node 552 are therefore maintained. When the power supply is initially applied, the clock ENT is in the disabled state, that is, in the logic low state. As a result, the node 554 goes to a logic high state. Accordingly, the logic low state of the node 553 is maintained by the NAND gate 528. Therefore, even though the clock ΦENT is enabled to the logic high state in the cutting state of the fuse 524, the logic low state of the node 553 is maintained, thereby not enabling the clock ΦFCE to the logic high state. Accordingly, if the fuse 524 is cut, the clock ΦFCE is not enabled irrespective of the logic state of the clock ΦENT. As a result, the fuse cutting mode cannot be entered.

There are as many electrically programmable mode selection circuits 330-1 to 330-n, to which the clock ΦFCE is applied, as there are operating modes which can be utilized in the semiconductor memory device. In other words, in the operating mode of a dynamic random access memory device, there are the operating modes of 33 1, ×4, ×8, ×16, - - - according to the number of input/output pins, and there are the operating modes of 8K cycle and 4K cycle according to the refresh cycle. There can be operating modes such as a fast page mode, a static column mode, and an extended data output mode. In order to designate each such operating mode, the number of mode selection circuits 330-1 to 330-n should correspond to the number of operating modes. The mode selection circuits 330-1 to 330-n include the fuses for correspondingly designating the operating modes. The fuses for designating the operating modes perform a function of determining whether the operating mode is correspondingly selected or not. If the fuse associated with a particular operating mode is cut, the operating mode is designated. To select a fuse for cutting, the clock ΦFCE is commonly inputted to the mode selection circuits 330-1 to 330-n and at the same time a mode selection address Ai is correspondingly input to the mode selection circuits 330-1 to 330-n in which it is desired to cut a fuse. Accordingly, each of the mode selection circuits 330-1 to 330-n generates a clock ΦMi for enabling the designated operating mode by cutting the corresponding fuse when clock ΦFCE is enabled together with the corresponding selection address Ai. The mode selection circuits 330-1 to 330-n can be constructed as in FIGS. 6A and 6B.

Figure 6A:
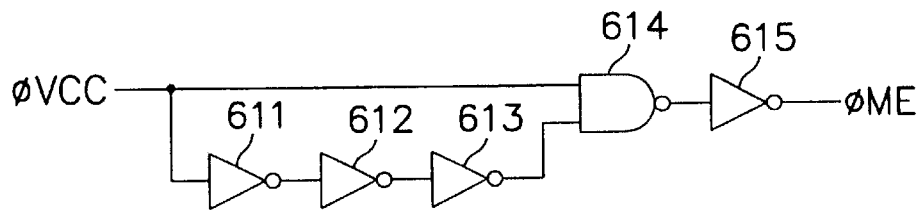
FIGS. 6A and 6B are views illustrating the structure of each of the electrically programmable mode selection circuits of FIG. 3.
Figure 6B:
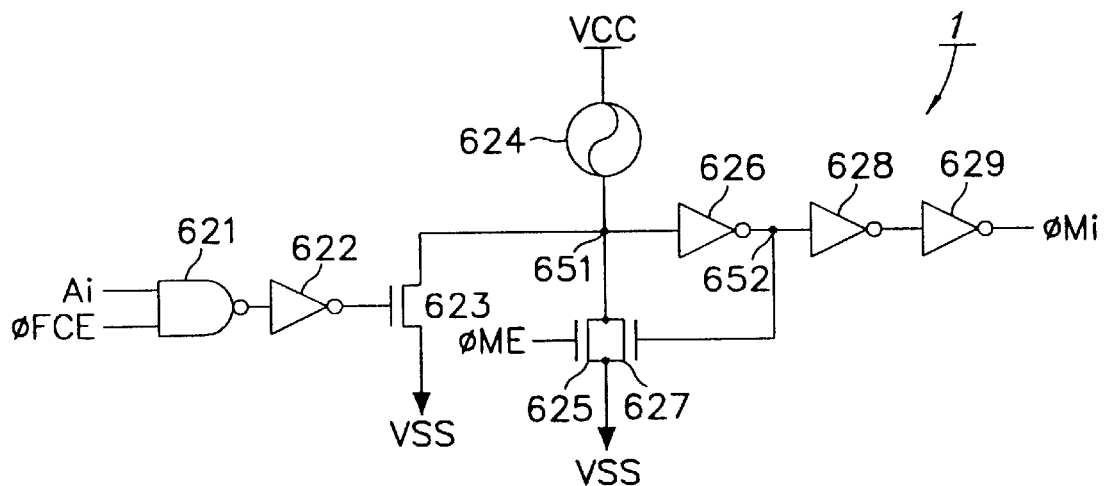

FIGS. 6A and 6B illustrate the construction of each mode selection circuit. Fuse 624 is an electrical fuse and an N-MOS transistor 623 is designed to have a large size for providing a current path which can cut the fuse 624, as is hereinafter explained.

First, when the fuse 624 is not cut, when the initial power supply voltage VCC is supplied, the signal ΦME, which is enabled during the delay cycle set by the inverters 611 to 613, is generated as described in FIG. 6A. When the signal ΦME is high, the N-MOS transistor 625 turns on, thereby forming a current path via the fuse 624 and the N-MOS transistor 625. When the current path passing through the fuse 624 and the N-MOS transistor 625 is formed, a voltage of the node 651 corresponding to the resistance ratio of the fuse 624 and the N-MOS transistor 625 is maintained. When the signal ΦME changes to a logic low state, the N-MOS transistor 625 turns off, so that the logic state of the node 651 goes to the power supply voltage VCC level. Accordingly, the logic state of the node 652 becomes a logic low state by the invertor 626, thereby turning off the N-MOS transistor 627. When the logic state of the node 652 becomes a logic low state, the logic state of the clock ΦMi output through inverters 628 and 629 also assumes a logic low state, which means that the operating mode is not selected.

Second, if the clock ΦFCE is enabled and the corresponding mode selection address Ai is not enabled, a logic high signal is output from the NAND gate 621. As a result, the N-MOS transistor 623 turns off, so that the potential of node 65 1 is maintained as the power supply voltage VCC. Accordingly, in the case that the corresponding mode selection address Ai is not enabled even though the clock ΦFCE is enabled, the clock ΦMi is not enabled.

Third, if the clock ΦFCE and the mode selection address Ai are high, a logic low signal is output from the NAND gate 621. The logic high signal is input through the invertor 622 to the gate electrode of the N-MOS transistor 623, thereby turning on the N-MOS transistor 623. As a result, a current path passing through the fuse 624 and the N-MOS transistor 623 is formed. A large current flows in N-MOS transistor 623 thereby opening the fuse 624. When the fuse 624 is cut, the logic state of the node 651 becomes the logic low state and the logic state of the node 652 becomes a logic high state due to the invertor 626. Accordingly, the clock ΦMi output from the inverters 628 to 629 is enabled to the logic high state. The clock ΦMi is the signal for enabling the operating mode which is designated in the corresponding mode selection circuit.

When the fuse 624 is cut as in the above, the clock ΦMi is generated when the signal ΦME is generated, i.e., each time VCC is applied, so that the designated operating mode is enabled.

Fourth, if the fuse 524 is opened in the fuse cutting enable circuit 320, the disabled state of the clock ΦFCE is always maintained as in the above. Therefore, the clock ΦFCE input to the NAND gate 621 of FIG. 6B is always in the logic low state and the mode selection circuits can not perform anymore fuse cutting operations. Accordingly, if the fuse 524 of the fuse cutting enable circuit 320 is cut, thereby disabling the clock ΦFCE, the fuse cutting operation of the mode selection circuits 330-1 to 330-n is stopped.

Figure 7:
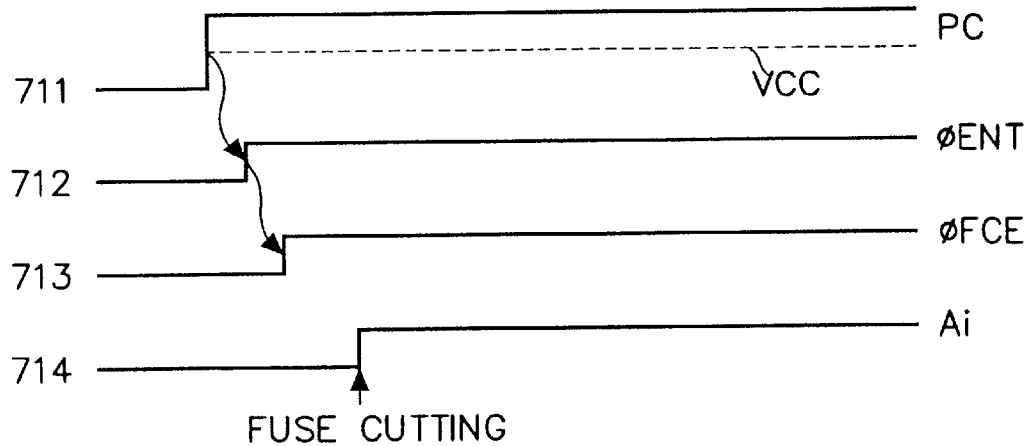
FIG. 7 is a view illustrating wave forms generated by the circuit of FIG. 3.

Referring to FIG. 7, if the signal PC is enabled such as 711 of FIG. 7, the fuse cutting mode-in circuit 310 senses the signal PC, thereby enabling the clock ΦENT, for entering the fuse cutting mode, such as 712 As will be recalled, the signal PC utilizes a high voltage signal having a voltage level higher than the power supply voltage VCC, as shown in signal 711.

If the clock ΦENT is enabled, such as 712 of FIG. 7, the fuse cutting enable circuit 320 enables the clock ΦFCE, such as 713 of FIG. 7, when the fuse cutting control address A0 is not enabled. In other words, as illustrated in FIGS. 5A and 5B, in the case that the clock ΦENT is enabled to the logic high state at the time of the logic low state of the fuse cutting control address A0, the clock ΦFCE is enabled to the logic high state, such as 713 of FIG. 7.

The clock ΦFCE is commonly input to the mode selection circuits 330-1 to 330-n, and the corresponding mode selection address Ai is respectively input to the mode selection circuits 330-1 to 330-n associated with the operating modes which are desired to be designated. Accordingly, if the mode selection address Ai corresponding to the mode selection circuits 330-1 to 330-n is enabled to the logic high state, such as 714 of FIG. 7, at the time of the enabling state of the clock ΦFCE, each of the mode selection circuits 330-1 to 330-n constructed as in FIGS. 6A and 6B cuts the fuse for designating the operating mode of the associated mode selection circuit, thereby designating the associated operating mode. Accordingly, the mode selection circuits 330-1 to 330-n perform the operating mode designating operation in dependence upon the logic state of the mode selection address Ai input when clock ΦFCE is also enabled.

After such fuse cutting is performed, thereby completing designation of the operating mode, the fuse cutting control address A0 is enabled while the clock ΦFCE is also enabled. Fuse cutting enable circuit 320 then cuts the internal fuse 524 thereby maintaining clock ΦFCE in a disabled state irrespective of the logic state of the clock ΦENT. Accordingly, mode selection circuits 330-1 to 330-n are unable to designate any more operating modes.

As described above, various operating modes of the semiconductor memory device are designated by utilizing an electrical fuse. The operating mode of the semiconductor memory device can be designated even after packaging thereof. When the operating mode of a semiconductor memory device can be designated in a packaged state, the total stock of the semiconductor memory device corresponding to the operating mode which is demanded can be easily controlled, thereby preventing the semiconductor memory device from being oversupplied or short supplied. Also, even though a package does not pass a test for a specific operating mode, it may be able to pass the test for other operating modes. If the particular operating mode of the semiconductor memory device can be converted into another operating mode even after packaging, the semiconductor memory device may be operated in the converted operating modes, thereby improving the total yield of the semiconductor memory devices.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A method of designating operating modes of a semiconductor memory device of the type having a plurality of operating-mode fuses each of which cause the device to operate in a first mode when the fuse is closed and in a second mode when the fuse is open, comprising:

preselecting one of the first or second modes from the group of operating modes consisting of pin ratio mode, refresh cycle mode, fast page mode, static column mode, and extended data out mode;

applying a fuse-cutting enabling signal to a first pad mounted on said device, the first pad being accessible to a user after the device is packaged;

applying a fuse address signal on a second pad mounted on said device and associated with one of said fuses, the second pad being accessible to a user after the device is packaged;

opening the associated fuse responsive to the presence of both said fuse-cutting enabling signal and said fuse address signal thereby designating the preselected mode, wherein said device further includes a fuse-cutting disabling fuse which when open prevents opening of any of said operating-mode fuses; and thereafter opening said fuse-cutting disabling fuse responsive to the fuse-cutting enabling signal and an address signal applied to said first and second pads.

2. A circuit for designating an operating mode of a dynamic random access memory device having various operating modes, comprising:

a fuse-cutting mode-in circuit operable to generate a fuse-cutting enable clock signal responsive to application of a preselected signal;

a fuse-cutting mode enable circuit including a first fuse which opens by an electrical cut to generate a fuse-cutting mode enabling signal responsive to the fuse-cutting enable clock signal and a first address signal received on an external pad accessible to a user; and a plurality of mode-selection circuits each designating one of the plurality of operating modes, each mode-selection circuit including a mode-selection fuse which opens by an electrical cut to select the designated operating mode responsive to the fuse-cutting mode enabling signal, and a second address signal received on an external pad accessible to a user.

3. The circuit of claim 2 wherein said mode-selection units each have an address input node and wherein said mode-selection fuse opens in the presence of said fuse-cutting mode enabling signal and a signal on said address input node.

4. The circuit of claim 3 wherein said fuse-cutting mode disabling circuit includes an address input node and wherein said fuse-cutting disabling fuse opens in the presence of said fuse-cutting mode enabling signal and a signal on said fuse-cutting mode disabling circuit address input node.

5. A circuit for designating an operating mode of a packaged semiconductor memory device, the circuit comprising:

a plurality of input pads accessible to a user after the device is packaged;

a fuse cutting mode circuit having a first input and output terminals, where the first input terminal is coupled to a first one of the input pads and the fuse cutting mode circuit is configured to generate a first logic level of a fuse cutting enable clock at the first output terminal responsive to a fuse cutting mode entry request signal being received at the first input terminal;

a fuse cut enable circuit having second and third input terminals, a second output terminal and including a first fuse, where the second input terminal is coupled to a second one of the input pads and the third input terminal is coupled to the first output terminal, where the fuse cut enable circuit is configured to cut the first fuse responsive to the first logic level of a fuse cutting mode enable signal and a first logic level of a signal received at the second input terminal, and where the fuse cut enable circuit is further configured to generate the fuse cutting mode enable signal at the second output terminal, the fuse cut enable circuit generating a first logic level of the fuse cutting mode enable signal responsive to the second fuse being closed and a first logic level of a signal received at the second input terminal and generating a second logic level of the fuse cut enable signal when the second fuse is open; and a mode selection circuit having fourth and fifth input terminals and a third output terminal and including a second fuse, where the fourth input terminal is coupled to a third one of the input pads and the fifth terminal is coupled to the second output terminal, the mode selection circuit being configured to generate a first logic level for an operating mode signal at the third output terminal when the second fuse is open and a second logic level for the operating mode signal when the second fuse is closed, the mode selection circuit being further configured to cut the second fuse responsive to a first logic level for a signal received at the fourth input terminal and the first logic level of the fuse cutting mode enable signal received at the fifth input terminal.

6. A packaged dynamic random access memory device comprising:

a plurality of pads accessible to a user;

a circuit for selecting one of a plurality of operating modes of the device comprising:

a fuse cutting mode-in circuit for generating a fuse-cutting enable clock signal responsive to a predetermined signal received on a first pad of the plurality of pads;

a fuse cutting enable circuit for generating a fuse cutting enable signal responsive to the fuse-cutting enable clock signal and a first address signal applied to a second pad of the plurality of pads, the fuse cutting enable circuit including a first fuse; and a plurality of mode selection circuits, each mode selection circuit including a mode selection fuse and being constructed and arranged to designate one of the operating modes from the group of operating modes including a pin ratio mode, a refresh cycle mode, a fast page mode, a static column mode, and an extended data out mode, being operably connected to a corresponding one of the plurality of pads, generating a mode selection signal responsive to a state of the mode selection fuse, and opening the mode selection fuse responsive to the fuse cutting enable signal and a corresponding address signal received on the corresponding pad.

* * * * *

UNITED STATES PATENT AND TRADEMARK OFFICE
CERTIFICATE OF CORRECTION

PATENT NO.   : 6,141,282
DATED        : October 31, 2000
INVENTOR(S)  : Chin et al.

It is certified that error appears in the above-identified patent and that said Letters Patent is hereby corrected as shown below:

Column 6,
Line 31, "522" should read -- 552 --.

Column 7,
Line 14, "ent" should read -- Fent --.
Line 30, "of 331" should read -- of x1 --.

Column 8,
Line 16, "65 1" should read -- 651 --.

Signed and Sealed this

Twenty-ninth Day of October, 2002

*Attest:*

*Attesting Officer*

JAMES E. ROGAN
*Director of the United States Patent and Trademark Office*